United States Patent
Bensahel et al.

(10) Patent No.: US 6,372,581 B1
(45) Date of Patent: Apr. 16, 2002

(54) PROCESS FOR NITRIDING THE GATE OXIDE LAYER OF A SEMICONDUCTOR DEVICE AND DEVICE OBTAINED

(75) Inventors: Daniel Bensahel; Yves Campidelli; François Martin; Caroline Hernandez, all of Grenoble (FR)

(73) Assignee: France Telecom, Paris (FR)

( * ) Notice: Subject to any disclaimer, the term of this patent is extended or adjusted under 35 U.S.C. 154(b) by 0 days.

(21) Appl. No.: 09/403,356

(22) PCT Filed: Feb. 15, 1999

(86) PCT No.: PCT/FR99/00323
  § 371 Date: Oct. 18, 1999
  § 102(e) Date: Oct. 18, 1999

(87) PCT Pub. No.: WO99/43028
  PCT Pub. Date: Aug. 26, 1999

(30) Foreign Application Priority Data
  Feb. 18, 1998 (FR) .......................................... 98 01963

(51) Int. Cl.$^7$ ............................................. H01L 21/336
(52) U.S. Cl. ...................... 438/287; 257/324; 438/216; 438/775; 438/769; 438/786; 438/783
(58) Field of Search ................................ 438/216, 287, 438/591, 775, 769, 786, 783

(56) References Cited

U.S. PATENT DOCUMENTS 6,221,788 B1 * 4/2001 Kobayashi et al. ......... 438/762

OTHER PUBLICATIONS

Bhat et al. ("Effects of chemical composition on the electrical properties of NO–nitrided SiO2" Applied Physics Letters 66(10), pp. 1225–1227, Mar. 1995.*

Maiti et al. "Reoxidized nitric oxide (ReoxNO) process and its effect on the dielectric reliability of the LOCOS edge" IEEE Symposium on VLSI Technology, pp. 63–64, Jun. 1995.*

Kumar et al, "Optimization of sub 3 nm gate dielectrics grown by rapid thermal oxidation in a nitric oxide ambient," Appl. Phys. Lett., vol. 70, No. 3, Jan. 1997, pp. 384–386.

(List continued on next page.)

*Primary Examiner*—Charles Bowers
*Assistant Examiner*—Erik Kielin
(74) *Attorney, Agent, or Firm*—Eric B. Meyertons; Conley, Rose & Tayon, P.C.

(57) ABSTRACT

A method of nitriding the gate oxide layer of a semiconductor device includes the chemical growth on a silicon substrate of a native silicon oxide layer $\leq 1$ nm thick; treating said substrate coated with the native silicon oxide layer with gas NO at a temperature $\leq 700°$ C. and a pressure level $\leq 10^4$ Pa to obtain a nitrided native silicon oxide layer; and the growth of the gate oxide layer. The method is applicable to PMOS devices.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

9 Claims, 3 Drawing Sheets

OTHER PUBLICATIONS

Laviale et al, "Study of Nitrogen Incorporation in Gate Oxides using the Resistance to Oxidation Method," Mat. Res. Soc. Symp. Proc., vol. 429, ©1996 by Material Research Society, pp. 251–256.

Guzev et al., "The composition of ultrathin silicon oxynitrides thermally grown in nitric oxide," J. Appl. Phys., vol. 82, No. 2, Jul. 1997, pp. 896–898.

Laviale et al., "Controlled Thin Oxidation and Nitridation in a Single Wafer Cluster Tool," Mat. Res. Soc. Symp. Proc., vol. 387, ©1995 by Material Research Society, pp. 253–257.

* cited by examiner

PROCESS FOR NITRIDING THE GATE OXIDE LAYER OF A SEMICONDUCTOR DEVICE AND DEVICE OBTAINED

The present invention relates in general to a process for fabricating semiconductor devices and, more particularly, to a process for nitriding the gate oxide layer ($SiO_2$) of a semiconductor device, for example a CMOS device.

The nitriding process according to, the invention proves particularly advantageous for the fabrication of semiconductor devices with a very thin gate oxide layer ($\leq 3$ nm, preferably $\leq 2.5$ nm).

With the decrease in the thickness of the gate oxide layer ($\leq 3$ nm) in semiconductor devices, such as for example PMOS devices, the diffusion of dopant atoms such as boron through the oxide layer during the subsequent heat treatments of the doped gate may impair the performance and reliability of the devices obtained.

Various solutions have been envisaged for remedying this problem of dopant-atom diffusion through the gate oxide layer.

One solution to this problem involves nitriding the gate oxide layer.

It has also been proposed to nitride the gate oxide layer with $NH_3$ or $N_2O$ gas.

However, although the oxynitride formed by $NH_3$ in the gate oxide layer leads to an acceptable barrier against diffusion of the dopant (boron), the incorporation of hydrogen atoms results in the presence of fixed charges and an increase in the trapping of electrons.

Conversely, the use of $N_2O$ is characterized by the absence of trapping but however, obtaining oxynitrides from $N_2O$ requires expensive thermal processes which are essential for obtaining the high nitrogen concentration at the $Si/SiO_2$ interface.

Further, annealing in $N_2O$ proves ineffective for nitriding thin oxide layers (<3 nm).

It has recently been proposed to use NO gas for nitriding gate oxide layers. In all cases, a gate oxide layer ($SiO_2$) was initially grown on the silicon substrate, then the gate oxide layer was nitrided using NO gas by a rapid thermal process (RTP). This process requires relatively high temperatures (850–900° C.) and pressures of $10^4$ Pa or more. Also, it does not allow the presence of nitrogen to be localized precisely at the interface between the substrate and the gate oxide layer ($Si/SiO_2$ interface).

It would be desirable to provide a process for nitriding the gate layer which remedies the drawbacks of the prior art.

In particular, a process for nitriding the gate oxide layer of a semiconductor device which makes it possible to restrict the diffusion of the dopant (boron) through the gate oxide layer for very thin gate oxide layers ($\leq 2.5$ nm), and which makes it possible to localize the presence of nitrogen at the interface between the substrate and the gate oxide layer would be desirable.

The above objects are achieved by providing a process for nitriding the gate oxide layer of a semiconductor device, including chemically growing a native silicon oxide layer with a thickness at most equal to 1 nm on a silicon substrate, treating the substrate coated with the native silicon oxide layer with nitric oxide (NO) gas at a temperature at most equal to 700° C. and under a pressure at most equal to $10^4$ Pa in order to obtain a gate oxide layer including nitrogen atoms principally located close to the substrate/gate oxide layer interface.

The rest of the description refers to the appended drawings, in which, respectively:

Referring to FIGS. 1a to 1d, the first step in the process includes chemically forming a "native" silicon oxide layer 2 with a thickness at most equal to 1 nm on the surface of a silicon substrate 1, doped for example by implanting boron atoms.

The silicon substrate may be made of polycrystalline or monocrystalline silicon.

The "native" silicon oxide layer may be formed in the following way:

After cleaning the surface of the silicon substrate 1 using any conventional process, the surface of the substrate is saturated with Si—H (and H—Si—H) bonds in a dilute aqueous HF solution (generally 1% strength or less). After rinsing with deionized water and drying (optionally aided by isopropyl alcohol), the substrate is exposed in a reactor to an ozone ($O_3$) gas flow (typically at a temperature $\leq 200°$ C. for a time shorter than 3 minutes) or an ozonized water solution (typically ozone-saturated deionized water at room temperature).

In both cases, an equivalent oxide thickness less than 1 nm is obtained.

In the case of forming the "native" oxide layer using an ozone gas flow, the subsequent nitriding step may be carried out in the same reactor.

The subsequent step includes nitriding the "native" oxide layer 2 in order to obtain a nitrided layer 3. This invention, this nitriding is carried out by bringing the substrate 1, coated with the "native" oxide layer 2, into contact in a reactor with NO gas at a temperature less than or equal to 700° C., preferably below 600° C. and at a pressure less than or equal to $10^5$ Pa, less than or equal to $10^3$ Pa, for a time of from a few seconds to several minutes, generally from 10 seconds to 1 or 2 minutes.

Once the "native" silicon oxide layer has been nitrided, a gate silicon oxide layer 4 is grown using any conventional process.

By way of example, the gate oxide layer 4 may be grown by subjecting the substrate, coated with the nitrided "native" oxide layer 3, to a pure or dilute dry oxygen atmosphere, at a temperature of 700–850° C. The duration of this oxidation-growth step is quite clearly dependent on the thickness desired for the gate oxide layer.

EXAMPLES

A 1 nm thick "native" silicon oxide layer is chemically grown, as indicated above, on a 200 mm silicon wafer.

This oxide layer is nitrided by subjecting the wafer, coated with the "native" oxide layer, to an NO gas atmosphere on a pressure of $10^3$ Pa at 550° C. for 30 seconds.

Figure 1A:
FIGS. 1a to 1d represent a schematic representation of the principal steps in the process according to the invention.
Figure 1B:
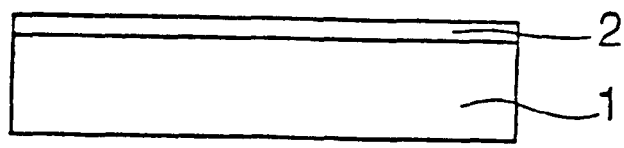
Figure 1C:
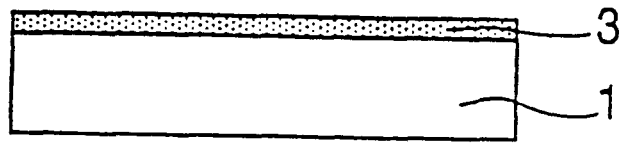
Figure 1D:
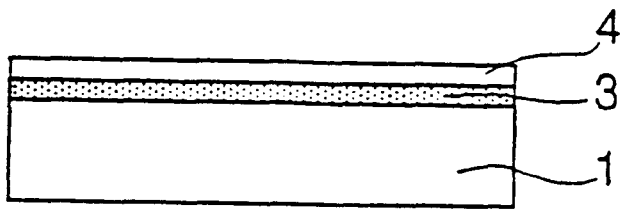
Figure 2:
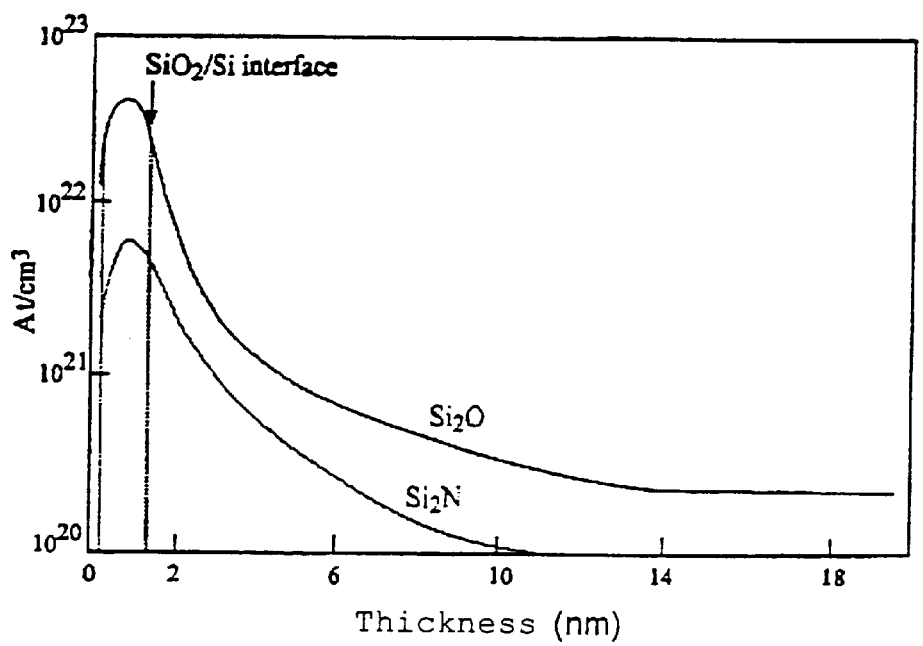
FIG. 2 represents a graph using secondary ion mass spectrography (SIMS) of the nitriding profile of a 1 nm thick "native" silicon oxide layer nitrided using the process described herein before growing the gate oxide layer.

As shown by FIG. 2, there is significant nitriding of the "native" oxide layer (the tails of the $SiO_2$, $Si_2N$ curves are abrasion artifacts)

A silicon oxide layer is then grown on the nitrided oxide layer by treating the silicon wafer having the nitrided "native" oxide layer using an oven in a dry oxygen atmosphere at 850° C. for 5 minutes in order to obtain a 2.2 mm thick gate oxide layer (SiO$_2$)

Figure 3:
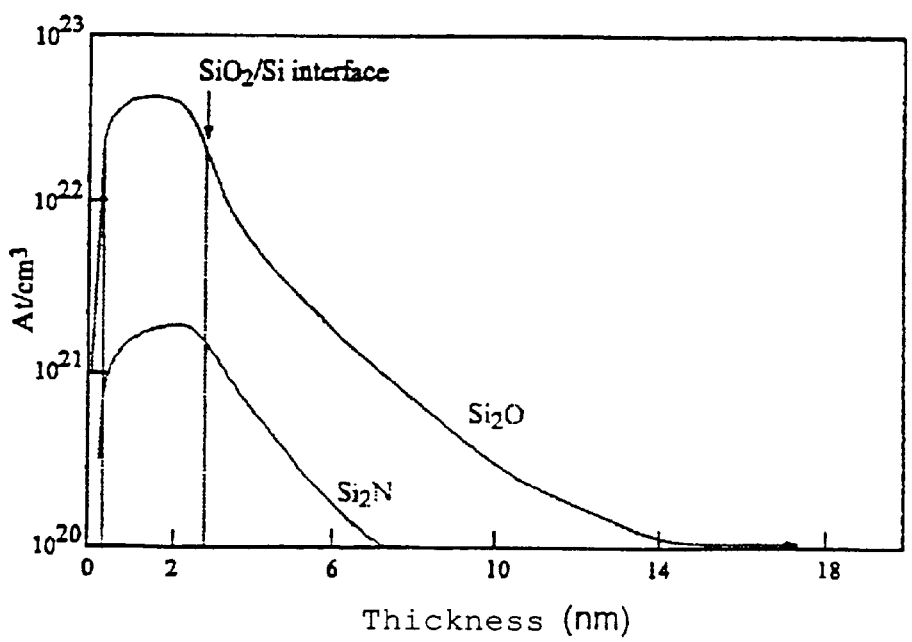
FIG. 3 represents a graph using SIMS of the nitriding profile after growing the gate oxide.

FIG. 3 shows that the nitrogen inside the oxide layer is principally located close to the Si/SiO$_2$ interface.

Figure 4:
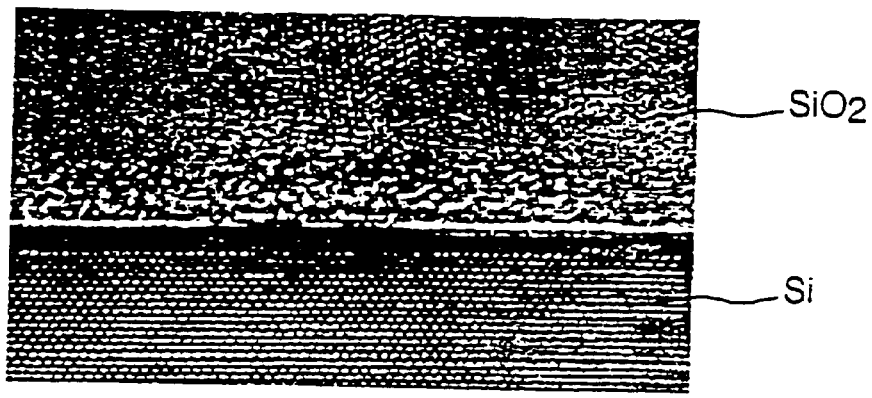
FIG. 4 represents a microphotograph using transmission electron microscopy of a section of a 2.2 nm thick gate oxide layer obtained using the process described herein

FIG. 4 shows that the interface obtained between this silicon substrate and the gate oxide layer SiO$_2$ is perfectly plane.

Various devices having a gate oxide layer nitrided as described herein invention and, for comparison, a device having an unnitrided gate oxide layer, were made:

1—Device 1:
  Nitriding: NO gas; 700° C.; 10$^3$ Pa; 30 seconds.
  Growth of the oxide layer after nitriding: dry O$_2$; 850° C.; 5 minutes.
  Thickness of the gate oxide layer 2.2 nm.
2—Device 2:
  Nitriding: NO gas; 550° C.; 10$^3$ Pa; 30 seconds.
  Growth of the gate oxide layer: dry O$_2$ (100%); 50° C.; 5 minutes.
  Thickness of the gate oxide layer: 2.4 nm.
3—Device 3:
  Nitriding: NO gas; 550° C.; 10$^3$ Pa; 30 seconds.
  Growth of the gate oxide layer: dry O$_2$; 800° C.; 5 minutes.
  Thickness of the gate oxide layer: 2.2 nm.
4—Device 4:
  Nitriding: NO gas; 550° C.; 1 Pa; 5 seconds.
  Growth of the gate oxide layer: dry O$_2$; 800° C.; 5 minutes.
  Thickness of the gate oxide layer: 2.3 nm.
5—Device A:
  Growth of the gate oxide layer: dry O$_2$; 800° C.; 5 minutes.
  Thickness of the gate oxide layer: 2.5 nm.

Figure 5:
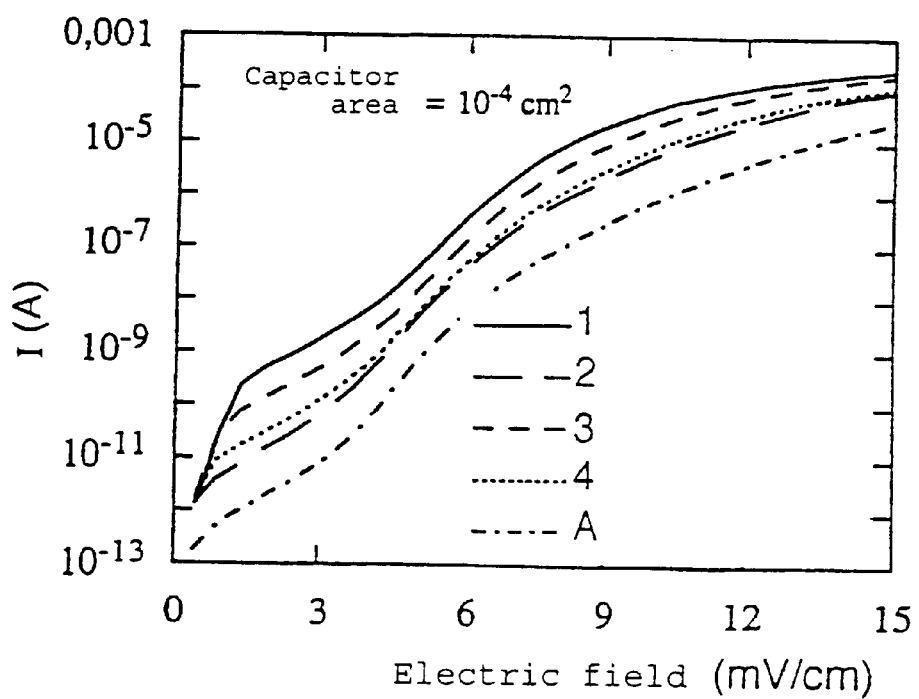
FIG. 5 represents graphs I(V) as a function of the applied electric field for various devices including a gate oxide layer obtained using the process described herein and a device having an unnitrided gate oxide layer.

FIG. 5 shows that the devices obtained using the process of the invention have reduced tunnel conduction compared with a device having an unnitrided conventional gate oxide layer.

What is claimed is:

1. Process for nitriding a gate oxide layer of a semiconductor device, comprising:

chemically growing a native silicon oxide layer with a thickness at most equal to 1 nm on a silicon substrate, wherein chemically growing the native silicon oxide layer comprises bringing the silicon substrate into contact with an aqueous ozone solution or ozone gas, treating the substrate coated with the native silicon oxide layer with nitric oxide gas at a temperature at most equal to 700° C. and under a pressure at most equal to 10$^4$ Pa for a time of between about 5 to 30 seconds in order to obtain a nitrided native silicon oxide layer, and growing an oxide layer on the substrate coated with the nitrided native silicon oxide layer in order to obtain a gate oxide layer comprising nitrogen atoms, wherein the nitrogen atoms are from 0 to about 1 nm from the substrate/gate oxide layer interface.

2. Nitriding process according to claim 1, wherein treating the substrate with nitric oxide gas is carried out at a temperature below 600° C., and under a pressure of less than 10$^3$ Pa.

3. The process according to claim 1, wherein the nitrogen at the substrate/gate oxide layer interfaces in between 10$^{21}$ and 10$^{22}$ atoms per cm$^3$.

4. Nitriding process according to claim 1, further comprising cleaning the substrate with a dilute aqueous hydrofluoric acid solution prior to chemically growing the native silicon oxide layer.

5. Nitriding process according to claim 1, wherein growing the gate oxide layer comprises oxidizing the substrate coated with the nitrided native silicon oxide layer with a pure or dilute dry oxygen atmosphere at a temperature of 700 to 850° C.

6. Nitriding process according to claim 1, wherein the substrate comprises a monocrystalline or polycrystalline silicon substrate.

7. Process according to claim 1, wherein the gate oxide layer has a thickness equal to or less than 2.5 nm.

8. Process according to claim 1, wherein treating the substrate with nitric oxide gas is carried out at a temperature of 500° C. at a pressure of 10$^3$ Pa.

9. The process according to claim 1, wherein the gate oxide layer has a thickness equal to or less than 2.5 nm.

* * * * *

UNITED STATES PATENT AND TRADEMARK OFFICE
CERTIFICATE OF CORRECTION

PATENT NO. : 6,372,581 B1
DATED : April 16, 2002
INVENTOR(S) : Bensahel et al.

It is certified that error appears in the above-identified patent and that said Letters Patent is hereby corrected as shown below:

<u>Title page,</u>
Item [86], PCT No.:, please delete "PCT/FR99/00323" and substitute therefor
-- PCT/FR99/00328 --

<u>Column 4,</u>
Line 23, please delete "interfaces in" and substitute therefor -- interface is --

Signed and Sealed this

Twenty-fourth Day of September, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO.   : 6,372,581 B1                                             Page 1 of 1
DATED        : April 16, 2002
INVENTOR(S)  : Daniel Bensahel et al.

It is certified that error appears in the above-identified patent and that said Letters Patent is hereby corrected as shown below:

<u>Title page,</u>
Item [73], Assignee, after "France Telecom" please insert -- and COMMISSARIAT A L'ENERGIE ATOMIQUE --.

Signed and Sealed this

Fourth Day of February, 2003

JAMES E. ROGAN
*Director of the United States Patent and Trademark Office*